United States Patent
Yu et al.

(10) Patent No.: US 9,607,888 B2
(45) Date of Patent: Mar. 28, 2017

(54) INTEGRATION OF ALD BARRIER LAYER AND CVD RU LINER FOR VOID-FREE CU FILLING

(71) Applicant: Tokyo Electron Limited, Minato-ku, Tokyo (JP)

(72) Inventors: Kai-Hung Yu, Albany, NY (US);
Toshio Hasegawa, Albany, NY (US);
Tadahiro Ishizaka, Tokyo (JP);
Manabu Oie, Albany, NY (US);
Fumitaka Amano, Albany, NY (US);
Steven Consiglio, Albany, NY (US);
Cory Wajda, Albany, NY (US); Kaoru Maekawa, Albany, NY (US); Gert J. Leusink, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/613,086

(22) Filed: Feb. 3, 2015

(65) Prior Publication Data
US 2015/0221550 A1  Aug. 6, 2015

Related U.S. Application Data

(60) Provisional application No. 61/935,075, filed on Feb. 3, 2014.

(51) Int. Cl.
*H01L 21/768* (2006.01)
*H01L 21/285* (2006.01)
(Continued)

(52) U.S. Cl.
CPC ...... *H01L 21/76846* (2013.01); *C23C 16/045* (2013.01); *C23C 16/34* (2013.01);
(Continued)

(58) Field of Classification Search
None
See application file for complete search history.

(56) References Cited

U.S. PATENT DOCUMENTS 6,432,820 B1  8/2002  Lee et al.
7,985,680 B2  7/2011  Hasegawa et al.
(Continued)

FOREIGN PATENT DOCUMENTS

CN  100576474 C  12/2009

OTHER PUBLICATIONS

Korean Intellectual Property Office (KIPO), International Search Report and Written Opinion for corresponding International patent application No. PCT/US2015/014309, mailed on May 13, 2015, pp. 11.

(Continued)

*Primary Examiner* — Caleb Henry
*Assistant Examiner* — Mounir Amer
(74) *Attorney, Agent, or Firm* — Oblon, McClelland, Maier & Neustadt, L.L.P.

(57) ABSTRACT

Methods for integration of atomic layer deposition (ALD) of barrier layers and chemical vapor deposition (CVD) of Ru liners for Cu filling of narrow recessed features for semiconductor devices are disclosed in several embodiments. According to one embodiment, the method includes providing a substrate containing a recessed feature, depositing a conformal barrier layer by ALD in the recessed feature, where the barrier layer contains TaN or TaAlN, depositing a conformal Ru liner by CVD on the barrier layer, and filling the recessed feature with Cu metal.

20 Claims, 4 Drawing Sheets

(51) Int. Cl.
*H01L 23/532* (2006.01)
*C23C 16/04* (2006.01)
*C23C 16/34* (2006.01)

(52) U.S. Cl.
CPC .. *H01L 21/28562* (2013.01); *H01L 21/76877* (2013.01); *H01L 23/53238* (2013.01); *H01L 2924/0002* (2013.01)

(56) References Cited

U.S. PATENT DOCUMENTS

| | | | |
|---|---|---|---|
| 8,026,168 B2 | 9/2011 | Ishizaka et al. | |
| 2002/0145201 A1* | 10/2002 | Armbrust | H01L 21/7682 257/776 |
| 2009/0087981 A1 | 4/2009 | Suzuki et al. | |
| 2009/0130843 A1* | 5/2009 | Suzuki | H01L 21/28556 438/653 |
| 2009/0202710 A1 | 8/2009 | Marcadal et al. | |
| 2010/0102417 A1* | 4/2010 | Ganguli | C23C 16/34 257/532 |
| 2011/0263115 A1 | 10/2011 | Ganguli et al. | |
| 2013/0140698 A1 | 6/2013 | Lakshmanan et al. | |
| 2014/0220772 A1* | 8/2014 | Lakshmanan | H01L 21/76856 438/597 |
| 2014/0287577 A1* | 9/2014 | Emesh | H01L 21/76879 438/618 |

OTHER PUBLICATIONS

Kim, J.Y., et al. "Basic characteristics of TaN films deposited by using the remote plasma enhanced atomic layer deposition method," Journal of the Korean Physical Society, Oct. 2004, vol. 45, No. 4, pp. 1069-1073.

Park, J.S. et al., "Plasma-enhanced atomic layer deposition of tantalum nitrides using hydrogen radicals as a reducing agent," Electrochemical and Solid-State Letters, 2001, vol. 4, No. 4, pp. C17-C19.

Alen, P., Juppo et al., Atomic layer deposition of Ta(Al)N(C) thin films using trimethylaluminum as a reducing agent, Journal of the Electrochemical Society, vol. 148, No. 10, p. G566-G571, Aug. 31, 2001.

Notification of Examination Opinion dated Jan. 4, 2017 in corresponding TW Application Serial No. 104103528 (with English translation).

* cited by examiner

INTEGRATION OF ALD BARRIER LAYER AND CVD RU LINER FOR VOID-FREE CU FILLING

CROSS-REFERENCE TO RELATED APPLICATIONS

This application is related to and claims priority to U.S. Provisional application Ser. No. 61/935,075 filed on Feb. 3, 2014, the entire contents of which are herein incorporated by reference.

FIELD OF THE INVENTION

The present invention generally relates to integrating conformal barriers and liners with copper (Cu) metallization in semiconductor manufacturing.

BACKGROUND OF THE INVENTION

Back-end-of-line (BEOL) performance/area/cost scaling is the foremost issue for 10 nm/7 nm technology nodes. Metal lines and vias will continue to be the key areas for yield improvement, making line/via resistance as well as Cu fill the key technical challenges at 10 nm node and beyond.

Physical vapor deposition (PVD) of TaN has reached its limits to meet process requirements for precise thickness and composition control, conformality, uniformity as well as interlayer dielectric damage. Atomic layer deposition (ALD) of barrier layers show promise due to the nearly 100% conformality even in high aspect ratio structures, hence reducing "pinch off" and Cu void formation, without damaging the dielectric. However, ALD barriers have so far not delivered on their promise as PVD Ta flash deposition and/or PVD Cu seed layers were still needed to provide a good barrier-Cu interface.

SUMMARY OF THE INVENTION

Embodiments of the invention provide methods for superior Cu metal filling of narrow, high-aspect-ratio recessed features used in semiconductor devices. According to an embodiment of the invention, void-free Cu metal filling is demonstrated in high aspect ratio (~10), 20 nm wide recessed features (lines) using a processing scheme that includes a cluster tool containing various process chambers. This new integration scheme enables wide process window and design flexibility of Cu interconnects for very narrow recessed features, including recessed features with widths of 10 nm and below.

According to one embodiment, a method is provided for forming a semiconductor device, where the method includes providing a substrate containing a recessed feature, depositing a conformal barrier layer by atomic layer deposition (ALD) in the recessed feature, wherein the barrier layer contains TaN or TaAlN, depositing a conformal Ru liner by chemical vapor deposition (CVD) on the barrier layer, and filling the recessed feature with Cu metal.

According to another embodiment, the method includes providing a substrate containing a recessed feature, depositing a conformal TaN barrier layer by ALD in the recessed feature, and depositing a conformal Ru liner by CVD on the TaN barrier layer, and filling the recessed feature with Cu metal using a ionized physical vapor deposition (IPVD) process, where the depositing the conformal TaN barrier layer includes sequentially first, exposing the substrate to a tantalum precursor, and second, exposing the substrate to a nitrogen precursor, and repeating the exposing steps one or more times.

According to another embodiment, the method includes providing a substrate containing a recessed feature, depositing a conformal TaAlN barrier layer by ALD in the recessed feature, and depositing a conformal Ru liner by CVD on the TaAlN barrier layer. The method further includes filling the recessed feature with Cu metal using an IPVD process, where the depositing the conformal TaAlN barrier layer includes sequentially first, exposing the substrate to a tantalum precursor, and second, exposing the substrate to the nitrogen precursor, and sequentially first, exposing the substrate to an aluminum precursor, and second, exposing the substrate to the nitrogen precursor.

DETAILED DESCRIPTION OF SEVERAL EMBODIMENTS

Figure 1:
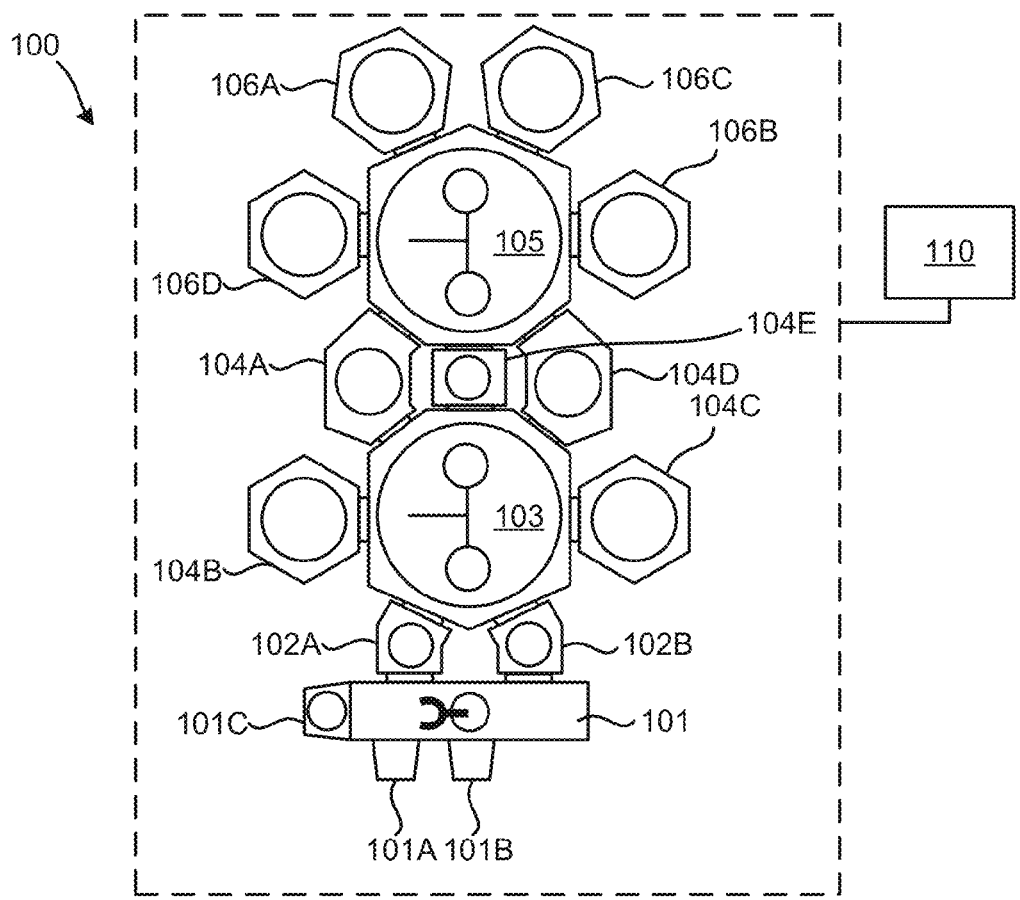
FIG. 1 is a schematic diagram of a vacuum cluster tool for performing integrated processing according to embodiments of the invention.

Methods for integration of ALD barrier layer and CVD Ru liner for Cu filling of narrow recessed features are disclosed in several embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the drawings are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

The integration of ALD barrier layer and CVD Ru liner for Cu filling of recessed features was performed on a Trias-Tandem® cluster tool available from Tokyo Electron Limited (Akasaka, Japan). The cluster tool included a Degas/Pre-Clean process chamber, an ALD barrier layer deposition chamber, a PVD barrier layer deposition chamber, a CVD Ru liner deposition chamber, and an IPVD deposition chamber.

FIG. 1 is a schematic diagram of a vacuum cluster tool for performing integrated processing according to embodiments of the invention. The vacuum processing tool 100 contains a substrate (wafer) transfer system 101 that includes cassette modules 101A and 101B, and a substrate alignment module 101C. Load-lock chambers 102A and 102B are coupled to the substrate transfer system 101. The substrate transfer system 101 is maintained at atmospheric pressure but a clean environment is provided by purging with an inert gas.

The load lock chambers 102A and 102B are coupled to a substrate transfer system 103. The substrate transfer system 103 may be maintained at a very low base pressure (e.g., $5\times10^{-8}$ Torr, or lower), using a turbomolecular pump (not shown). The substrate transfer system 103 includes a substrate transfer robot and is coupled to degassing/$H_2$ preclean systems 104A and 104D, and processing systems 104B and 104C. According to one embodiment, processing system 104B may be configured for performing IPVD for Cu filling of recessed features, and processing system may be configured for performing ALD of TaN and TaAlN barrier layers.

Furthermore, the substrate transfer system 103 is coupled to a substrate transfer system 105 through substrate handling chamber 104E. As in the substrate transfer system 103, the substrate transfer system 105 may be maintained at a very low base pressure (e.g., $5\times10^{-8}$ Torr, or lower), using a turbomolecular pump (not shown). The substrate transfer system 105 includes a substrate transfer robot. Coupled to the substrate transfer system 105 are processing systems 106A configured for performing IPVD of Ta and TaN, processing system 106B configured for performing CVD Ru, processing system 106C for performing IPVD for depositing a Cu seed layer, and processing system 106D configured for Ar sputtering.

According to one embodiment of the invention, the processing system 106B may be a CVD Ru system utilizing a deposition gas containing $Ru_3(CO)_{12}$ and CO for depositing Ru liners. An exemplary CVD Ru system and method of operating is described in detail in U.S. Pat. No. 7,270,848, the entire contents of which are herein incorporated by reference.

The vacuum processing tool 100 includes a controller 110 that can be coupled to and control any or all of the processing systems and processing elements depicted in FIG. 1 during the integrated substrate processing. Alternatively, or in addition, controller 110 can be coupled to one or more additional controllers/computers (not shown), and controller 110 can obtain setup and/or configuration information from an additional controller/computer. The controller 110 can be used to configure any or all of the processing systems and processing elements, and the controller 110 can collect, provide, process, store, and display data from any or all of the processing systems and processing elements. The controller 110 can comprise a number of applications for controlling any or all of the processing systems and processing elements. For example, controller 110 can include a graphic user interface (GUI) component (not shown) that can provide easy to use interfaces that enable a user to monitor and/or control one or more processing systems processing elements.

The controller 110 can include a microprocessor, memory, and a digital I/O port capable of generating control voltages sufficient to communicate, activate inputs, and exchange information with the vacuum processing tool 100 as well as monitor outputs from the vacuum processing tool 100. For example, a program stored in the memory may be utilized to activate the inputs of the vacuum processing tool 100 according to a process recipe in order to perform integrated substrate processing. The controller 110 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 110 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 110, for driving a device or devices for implementing the invention, and/or for enabling the controller 110 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 110 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive.

Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 110.

The controller 110 may be locally located relative to the vacuum processing tool 100, or it may be remotely located relative to the vacuum processing tool 100. For example, the controller 110 may exchange data with the vacuum processing tool 100 using at least one of a direct connection, an intranet, the Internet and a wireless connection. The controller 110 may be coupled to an intranet at, for example, a customer site (i.e., a device maker, etc.), or it may be coupled to an intranet at, for example, a vendor site (i.e., an equipment manufacturer). Additionally, for example, the controller 110 may be coupled to the Internet. Furthermore, another computer (i.e., controller, server, etc.) may access, for example, the controller 110 to exchange data via at least one of a direct connection, an intranet, and the Internet. As also would be appreciated by those skilled in the art, the controller 110 may exchange data with the vacuum processing tool 100 via a wireless connection.

As those skilled in the art will readily recognize, embodiments of the invention may not require the use of all the processing systems of the vacuum processing tool 100 depicted in FIG. 1. As described above, the vacuum processing tool 100 may contain two processing system (e.g., processing systems 104c and 106C) configured for performing the same or similar processing. This may be done in order to increase wafer throughput of the vacuum processing tool 100. Thus, some embodiments of the invention may include the use of less than all the processing systems depicted in FIG. 1.

Figure 2:
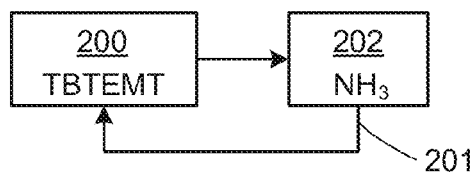
FIG. 2 schematically shows an ALD sequence for depositing a TaN barrier layer according to an embodiment of the invention.

FIG. 2 schematically shows an ALD sequence for depositing a TaN barrier layer according to an embodiment of the invention. The ALD sequence includes sequentially first, in 200, exposing the substrate to a tantalum precursor, for example (tBuN)Ta(NEtMe)$_3$ (TBTEMT), and second, in 202, exposing the substrate to a nitrogen precursor, for example NH$_3$. Thereafter, as indicated by process arrow 201, the exposing steps 200 and 202 may be repeated one or more times until the ALD TaN barrier layer has a desired thickness.

According to embodiments of the invention, the tantalum precursor may selected from the group consisting of Ta(NMe$_2$)$_3$(NCMe$_2$Et) (TAIMATA), Ta(NEt$_2$)$_5$ (PDEAT), Ta(NMe$_2$)$_5$ (PDMAT), Ta(NEtMe)$_5$ (PEMAT), (tBuN)Ta(NMe$_2$)$_3$ (TBTDMT), (tBuN)Ta(NEt$_2$)$_3$ (TBTDET), (tBuN)Ta(NEtMe)$_3$ (TBTEMT), and (iPrN)Ta(NEt$_2$)$_3$ (IPTDET).

Figure 3:
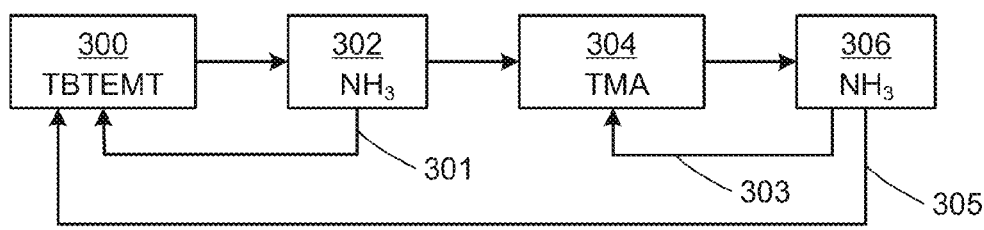
FIG. 3 schematically shows an ALD sequence for depositing a TaAlN barrier layer according to an embodiment of the invention.

FIG. 3 schematically shows an ALD sequence for depositing a TaAlN barrier layer according to an embodiment of the invention. The ALD sequence includes sequentially first, in 300, exposing the substrate to a tantalum precursor, for example TBTEMT, and second, in 302, exposing the substrate to a nitrogen precursor, for example NH$_3$. As indicated by process arrow 301, exposing steps 300 and 302 may be repeated one or more times. Thereafter, the ALD sequence further includes sequentially first, in 304, exposing the substrate to an aluminum precursor, and second, in 306, exposing the substrate to the nitrogen precursor. As indicated by process arrow 303, the exposing steps 304 and 306 may be repeated one or more times. Thereafter, steps 300, 302, 304, and 306 may be repeated until the TaAlN barrier layer has a desired thickness. The Ta:Al cycle ratio may be used to control the relative amounts of Ta and Al in the TaAlN barrier layer.

According to embodiments of the invention, the aluminum precursor may be selected from the group consisting of AlMe$_3$, AlEt$_3$, AlMe$_2$H, [Al(OsBu)$_3$]$_4$, Al(CH$_3$COCHCOCH$_3$)$_3$, AlCl$_3$, AlBr$_3$, AlI$_3$, Al(OiPr)$_3$, [Al(NMe$_2$)$_3$]$_2$, Al(iBu)$_2$Cl, Al(iBu)$_3$, Al(iBu)$_2$H, AlEt$_2$Cl, Et$_3$Al$_2$(OsBu)$_3$, Al(THD)$_3$, H$_3$AlNMe$_3$, H$_3$AlNEt$_3$, H$_3$AlNMe$_2$Et, and H$_3$AlMeEt$_2$.

Figure 4:
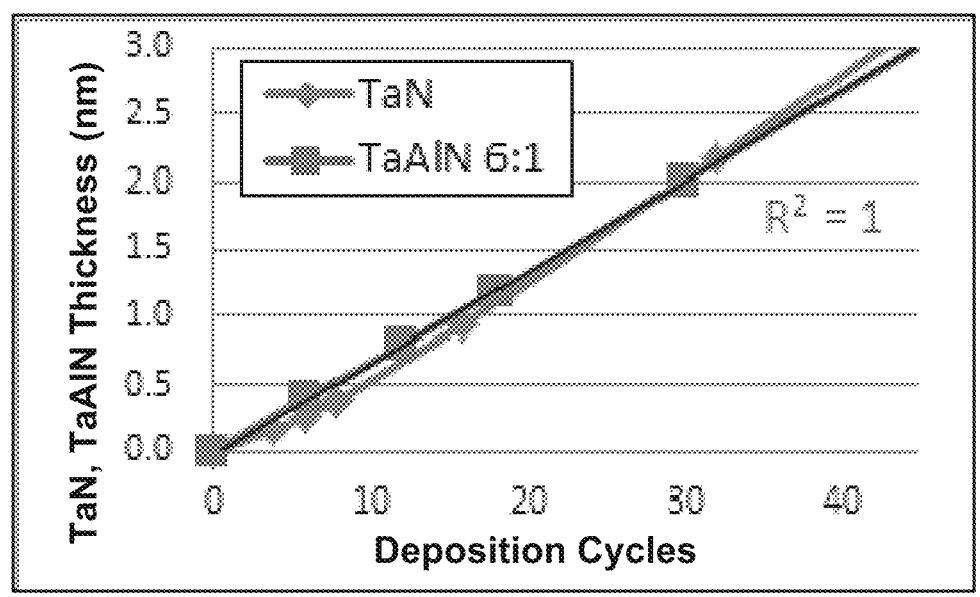
FIG. 4 shows TaN and TaAlN barrier layer thickness versus number of ALD cycles of according to an embodiment of the invention.

FIG. 4 shows TaN and TaAlN barrier layer thickness versus number of ALD cycles of according to an embodiment of the invention. The barrier layer thickness was measured by X-Ray Fluorescence/X-Ray Reflectometry (XRF/XRR). The ALD TaN barrier layers were deposited at a substrate temperature of 350° C. on blanket ultra-low-k (ULK) films with a dielectric constant (k) of 2.5. The ALD TaN process used alternating exposures of TBTEMT and NH$_3$. The ALD TaAlN barrier films were deposited by adding trimethylaluminum TMA/NH$_3$ cycles to the TBTEMTa/NH$_3$ cycles at Ta:Al cycle ratios of 4:1, 6:1, and 8:1, resulting in TaAlN barrier layers containing 21 atomic % Al, 15 atomic % Al, and 8 atomic % Al, respectively. As seen in FIG. 4, the deposition of both TaN and TaAlN barrier layers initializes well on the ULK substrates, and the excellent initial linearity of the ALD TaAlN process indicates superior surface initialization and film completion. Further, while the TaN barrier layer is crystalline, the addition of Al forms an amorphous TaAlN barrier layer.

Figure 5:
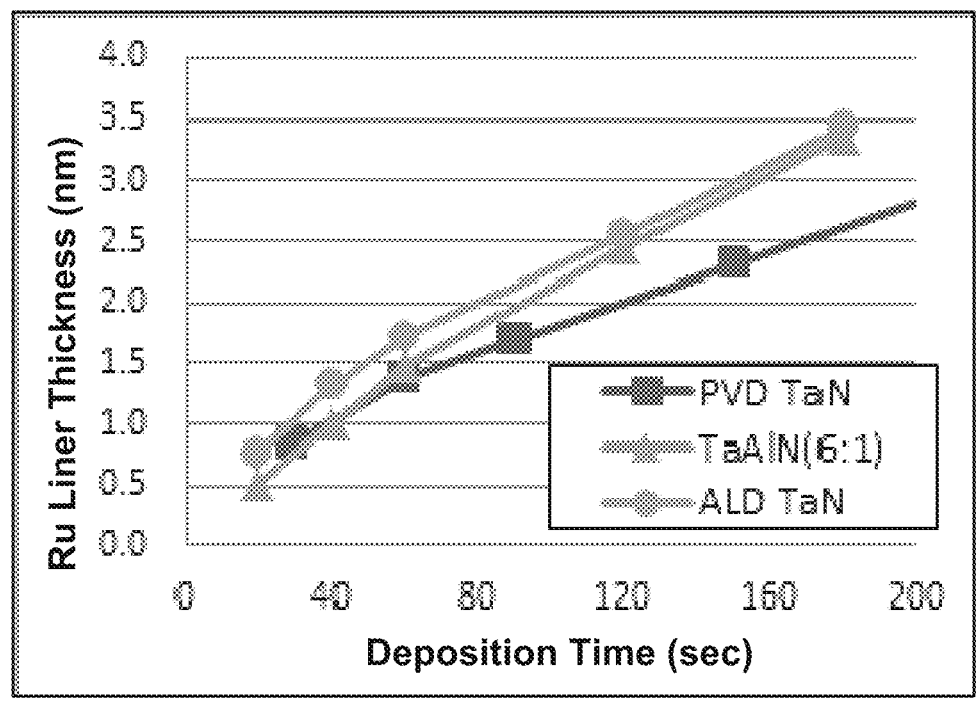
FIG. 5 shows Ru liner thickness versus deposition time for CVD Ru on different barrier layers according to an embodiment of the invention.

FIG. 5 shows Ru liner thickness versus deposition time for CVD Ru on different barrier layers according to an embodiment of the invention. The Ru liner films were deposited on ALD TaN layers, ALD TaAlN layers, and PVD TaN layers, using a Ru$_3$(CO)$_{12}$ precursor and CO as a carrier gas. The CVD Ru on the TaAlN layers with a Ta:Al of 6:1 shows almost ideal liner behavior for layer-by-layer growth while the CVD Ru on PVD TaN and ALD TaN films indicates distinct nucleation and growth regimes. The enhanced nucleation of ALD TaAlN on ULK and CVD Ru on TaAlN barrier layers illustrated in FIGS. 4 and 5 shows great promise to enable future thickness scaling and variability control. It is contemplated that the mechanism for the nucleation enhancement may be due to Al—CH$_3$ surface passivation/functionalization.

Figure 6:
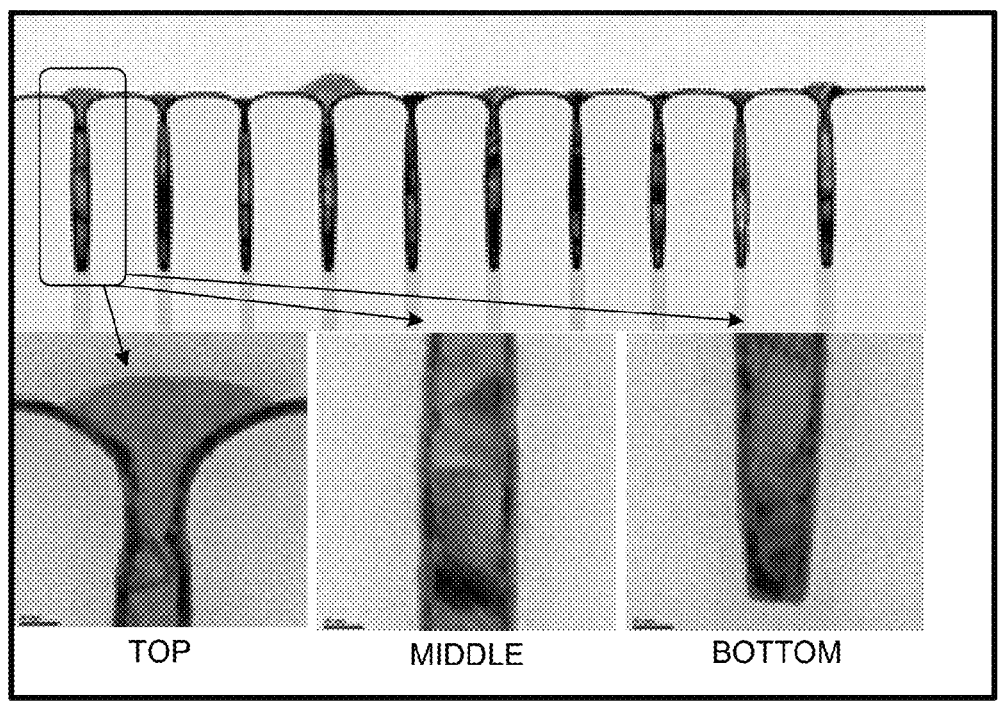
FIG. 6 shows cross-sectional transmission electron microscopy (XTEM) of Cu metal filling of recessed features according to an embodiment of the invention.

FIG. 6 shows XTEM of Cu metal filling of recessed features according to an embodiment of the invention. The recessed features were 20 nm wide and 200 nm deep and were generated by tetraethoxysilane (TEOS) back-filling of 40 nm wide recessed features. Due to the limited conformality of the TEOS back-filling process, the opening at the top of the recessed features was pinched-off to about 10 nm. The recessed features were processed by depositing 10 Angstrom (Å) of an ALD TaN barrier layer in the recessed features, and thereafter, depositing 20 Å of CVD Ru liner on the ALD TaN barrier layer. An IPVD process was then performed to fill the recessed features with Cu metal. A CuMn (1 at % Mn) sputtering target was used as a source of the Cu metal. The IPVD process was controlled to avoid pinch-off and field etching by adjusting Cu and Ar ions. An IPVD process is further described in U.S. Pat. No. 7,618,888, the entire contents of which are herein incorporated by reference.

Still referring to FIG. 6, the three enlarged cross-sections show the top, middle, and bottom of a Cu filled recessed feature. This shows that bottom-up void-free Cu filling of 10-20 nm wide recessed features can be achieved using the ALD TaN/CVD Ru/IPVD Cu integration scheme. The void-free Cu filling was enabled by the excellent step coverage of the TaN barrier layer and the Ru liner, and Cu wettability on the Ru liner which allows Cu diffusion into recessed features.

According to one embodiment, wherein the filling of the recessed features can include an IPVD process to partially fill the recessed feature and thereafter using a plating process to fill the recessed feature.

According to embodiments of the invention, the recessed features can, for example, have an aspect ratio (depth/width) greater than or equal to about 2:1, for example 3:1, 5:1, 10:1, 15:1, 20:1, 30:1, 40:1, 50:1, 60:1, 70:1, or greater than 70:1. In some embodiments, the recessed features can have an aspect ratio between about 20:1 and about 40:1, between about 40:1 and about 60:1, between about 60:1 and about 80:1, or between about 80:1 and about 100:1. The recessed features can have a width (opening) of about 200 nm or less, for example 150 nm, 100 nm, 65 nm, 32 nm, 22 nm, 10 nm or less. In some embodiments, the recessed features can have a depth between about 20 nm and about 5000 nm, for example between about 20 nm and about 100 nm, between about 100 nm and about 500 nm, between about 500 nm and about 1000 nm, or between about 1000 nm and about 5000 nm. However, embodiments of the invention are not limited to these aspect ratios, widths of recessed features, and depths of recessed features, as other aspect ratios, widths, and depths may be utilized. For example, the recessed features can be formed using a photolithographic process and dry etching techniques that are well known to persons skilled in the art.

Figure 7:
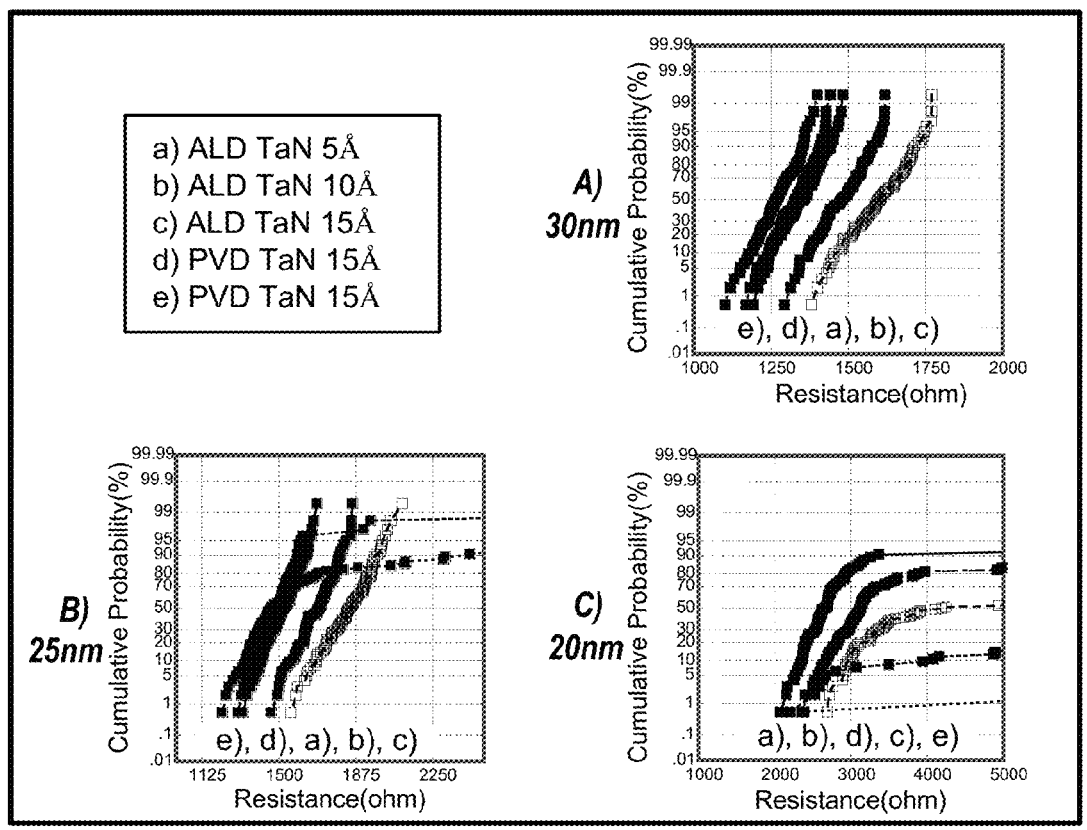
FIG. 7 shows line resistance results for different Cu filled recessed features according to an embodiment of the invention.

FIG. 7 shows line resistance results for different Cu filled recessed features according to an embodiment of the invention. The line resistance was measured using a prober. The different recessed features had widths of 30 nm, 25 nm, and 20 nm and were first processed with PVD TaN/CVD Ru or ALD TaN/CVD Ru before IPVD. The thickness of the PVD TaN barrier layer was 15 Angstrom, the thicknesses of the ALD TaN barrier layers were 5, 10, and 15 Å, and the thickness of the CVD Ru liner was 10 Å. As expected, the line resistance increased with decreasing line widths and increasing barrier layer thickness. The Cu fills that used PVD TaN diffusion barriers (d) and e)) started to fail at a line width of 25 nm while the Cu fills using ALD TaN showed extendibility when the line width is further scaled down.

Figures 8A, 8B, 8C:
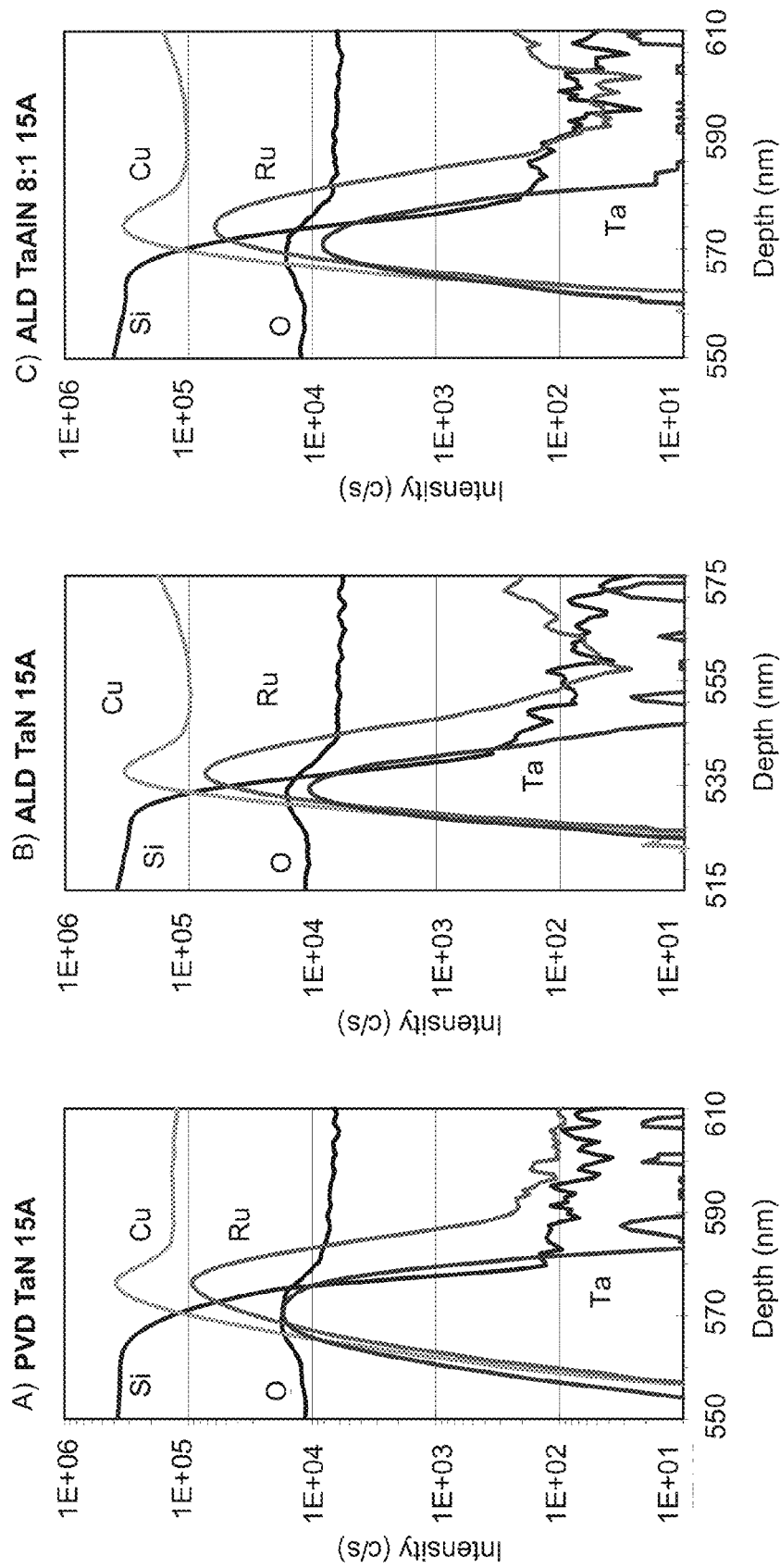
FIGS. 8A-8C show back-side SIMS data of PVD TaN, ALD TaN, and ALD TaAlN barrier layer performance against Cu diffusion according to an embodiment of the invention.

FIGS. 8A-8C show back-side SIMS data of PVD TaN, ALD TaN, and ALD TaAlN barrier layer performance against Cu diffusion according to an embodiment of the invention. The barrier integrity was measured following a 2.5 hour anneal at 375° C. FIG. 8A-8C show the results for Cu/CVD Ru/PVD TaN (15 Å), Cu/CVD Ru/ALD TaN (15 Å), and Cu/CVD Ru/ALD TaAlN (15 Å), respectively. The TaAlN diffusion barrier layer was deposited using Ta:Al cycle ratios of 8:1. The results show that all three barrier layers have good resistance against Cu diffusion.

A plurality of embodiments for methods of integration of ALD barrier layer and CVD Ru liner for Cu filling of narrow recessed features have been described. The methods provide a much needed solution for manufacturing semiconductor devices that require superior void-free Cu metal filling of narrow, high-aspect-ratio recessed features. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:
   providing a substrate containing a recessed feature;
   depositing a conformal barrier layer by atomic layer deposition (ALD) in the recessed feature, wherein the barrier layer contains TaN or TaAlN;
   sequentially after depositing the conformal barrier layer, depositing a conformal Ru liner by chemical vapor deposition (CVD) on the barrier layer; and
   sequentially after depositing the conformal Ru liner, filling the recessed feature with Cu metal, wherein said depositing steps and said filling step are performed in the same cluster tool.

2. The method of claim 1, wherein the filling includes an ionized physical vapor deposition (IPVD) process.

3. The method of claim 1, wherein the filling includes an ionized physical vapor deposition (IPVD) process to partially fill the recessed feature and thereafter using a plating process to fill the recessed feature.

4. The method of claim 1, wherein the depositing the TaN barrier layer includes
   a) sequentially first, exposing the substrate to a tantalum precursor, and second, exposing the substrate to a first nitrogen precursor; and
   b) repeating the exposing steps one or more times.

5. The method of claim 4, wherein the tantalum precursor is selected from the group consisting of $Ta(NMe_2)_3$ $(NCMe_2Et)$ (TAIMATA), $Ta(NEt_2)_5$ (PDEAT), $Ta(NMe_2)_5$ (PDMAT), $(NEtMe)_5$ (PEMAT), $(tBuN)Ta(NMe_2)_3$ (TBTDMT), $(tBuN)Ta(NEt_2)_3$ (TBTDET), $(tBuN)Ta(NEtMe)_3$ (TBTEMT), and $(iPrN)Ta(NEt_2)_3$ (IPTDET).

6. The method of claim 4, wherein the nitrogen precursor contains ammonia.

7. The method of claim 1, wherein the depositing the conformal TaAlN barrier layer includes
   a) sequentially first, exposing the substrate to a tantalum precursor, and second, exposing the substrate to a nitrogen precursor;
   b) sequentially first, exposing the substrate to an aluminum precursor, and second, exposing the substrate to the nitrogen precursor; and
   c) repeating a) and b) one or more times.

8. The method of claim 7, wherein the tantalum precursor is selected from the group consisting of $Ta(NMe_2)_3$ $(NCMe_2Et)$ (TAIMATA), $Ta(NEt_2)_5$ (PDEAT), $Ta(NMe_2)_5$ (PDMAT), $Ta(NEtMe)_5$ (PEMAT), $(tBuN)Ta(NMe_2)_3$ (TBTDMT), $(tBuN)Ta(NEt_2)_3$ (TBTDET), $(tBuN)Ta(NEtMe)_3$ (TBTEMT), and $(iPrN)Ta(NEt_2)_3$ (IPTDET).

9. The method of claim 7, wherein the nitrogen precursor contains ammonia.

10. The method of claim 7, wherein the aluminum precursor is selected from the group consisting of $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$, and $H_3AlMeEt_2$.

11. The method of claim 7, further comprising repeating a) one or more times before performing b).

12. The method of claim 7, further comprising repeating a) one or more times after performing b).

13. The method of claim 7, further comprising repeating a) one or more times before and after performing b).

14. The method of claim 7, further comprising repeating b) one or more times before repeating a).

15. The method of claim 1, wherein the depositing the Ru liner includes a deposition gas containing $Ru_3(CO)_{12}$ and CO.

16. A method of forming a semiconductor device, the method comprising provide a substrate containing a recessed feature;

depositing a conformal TaN barrier layer by atomic layer deposition (ALD) in the recessed feature;

sequentially after depositing the conformal TaN barrier layer, depositing a conformal Ru liner by chemical vapor deposition (CVD) on the barrier layer; and sequentially after depositing the conformal Ru liner, filling the recessed feature with Cu metal using an ionized physical vapor deposition (IPVD) process, wherein said depositing steps and said filling step are performed in the same cluster tool, and the depositing the conformal TaN barrier layer includes sequentially first, a) exposing the substrate to a tantalum precursor, and second, exposing the substrate to a nitrogen precursor, and b) repeating step a) one or more times.

17. The method of claim 16, wherein the tantalum precursor contains (tBuN)Ta(NEtMe)3 (TBTEMT) and the nitrogen precursor includes $NH_3$.

18. A method of forming a semiconductor device, the method comprising providing a substrate containing a recessed feature;

depositing a conformal TaAlN barrier layer by atomic layer deposition (ALD) in the recessed feature;

sequentially after depositing the conformal TaAlN layer, depositing a conformal Ru liner by chemical vapor deposition (CVD) on the barrier layer; and sequentially after depositing the conformal Ru liner, filling the recessed feature with Cu metal using an ionized physical vapor deposition (IPVD) process, wherein said depositing steps and said filling step are performed in the same cluster tool, and the depositing the conformal TaAlN barrier layer includes a) sequentially first, exposing the substrate to a tantalum precursor, and second, exposing the substrate to a nitrogen precursor, b) sequentially first, exposing the substrate to an aluminum precursor, and second, exposing the substrate to the nitrogen precursor, and c) repeating steps a) and b) one or more times.

19. The method of claim 18, wherein the tantalum precursor is selected from the group consisting of $Ta(NMe_2)_3$ $(NCMe_2Et)$ (TAIMATA), $Ta(NEt_2)_5$ (PDEAT), $Ta(NMe_2)_5$ (PDMAT), $Ta(NEtMe)_5$ (PEMAT), (tBuN)Ta$(NMe_2)_3$ (TBTDMT), (tBuN)Ta$(NEt_2)_3$ (TBTDET), (tBuN)Ta$(NEtMe)_3$ (TBTEMT), and (iPrN)Ta$(NEt_2)_3$ (IPTDET), wherein the nitrogen precursor contains ammonia, and wherein the aluminum precursor is selected from the group consisting of $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$, and $H_3AlMeEt_2$.

20. The method of claim 18, wherein the tantalum precursor contains (tBuN)Ta(NEtMe)$_3$ (TBTEMT), the aluminum precursor includes $AlMe_3$, and the nitrogen precursor includes $NH_3$.

* * * * *